United States Patent
Kim (10) Patent No.: US 7,256,492 B2
(45) Date of Patent: Aug. 14, 2007

(54) HEAT SINK AND DISPLAY PANEL INCLUDING HEAT SINK

(75) Inventor: Dong-An Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 22 days.

(21) Appl. No.: 11/504,635

(22) Filed: Aug. 16, 2006

(65) Prior Publication Data
US 2006/0273453 A1    Dec. 7, 2006

Related U.S. Application Data

(62) Division of application No. 10/934,690, filed on Sep. 7, 2004, now abandoned.

(30) Foreign Application Priority Data
Sep. 8, 2003    (KR) ................ 10-2003-0062544

(51) Int. Cl.
*H01L 23/10* (2006.01)
(52) U.S. Cl. ................ 257/706; 257/707; 257/717; 257/E23.051; 438/122
(58) Field of Classification Search ........... 257/706, 257/E23.051; 438/122
See application file for complete search history.

(56) References Cited

U.S. PATENT DOCUMENTS

| | | | |
|---|---|---|---|
| 4,199,654 A | | 4/1980 | DeRoss |
| 5,661,342 A | * | 8/1997 | Kawamoto ............ 257/712 |
| 6,255,722 B1 | * | 7/2001 | Ewer et al. ............ 257/676 |
| 6,404,065 B1 | | 6/2002 | Choi |

FOREIGN PATENT DOCUMENTS

| | | |
|---|---|---|
| KR | 87-11291 | 7/1987 |
| KR | 91-3771 | 2/1991 |
| KR | 91-3771 | 2/2002 |

\* cited by examiner

*Primary Examiner*—Long K. Tran
(74) *Attorney, Agent, or Firm*—Robert E. Bushnell, Esq.

(57) ABSTRACT

A heat sink that absorbs heat generated from at least one semiconductor device and dissipates the heat absorbed includes: a first surface adapted to match and contact at least one semiconductor device; a second surface having a fin structure adapted to dissipate heat from the heat sink into the air, the second surface arranged opposite to the first surface; combining portions having combining apertures each adapted to receive a predetermined combining element to affix the at least one semiconductor device to the heat sink, the combining apertures being arranged through the first surface and the second surface; and a protrusion arranged at a location of the first surface matching a point on an upper portion of the at least one semiconductor device; wherein the protrusion stops the at least one semiconductor device from rotating upon the at least one semiconductor device being affixed to the first surface of the heat sink by the combining element.

6 Claims, 13 Drawing Sheets

HEAT SINK AND DISPLAY PANEL INCLUDING HEAT SINK

CLAIM OF PRIORITY

This application makes reference to, incorporates the same herein, and claims all benefits accruing under 35 U.S.C. §119 from an application for HEAT SINK AND DISPLAY PANEL COMPRISING THE SAME earlier filed in the Korean Intellectual Property Office on 8 Sep. 2003 and there duly assigned Ser. No. 2003-62544 and is a division of application Ser. No. 10/934,690 filed on Sep. 07, 2004; now abandon.

BACKGROUND OF THE INVENTION

1. Field of the Invention

The present invention relates to a heat sink, and more particularly, to a heat sink for a heat source such as a high power semiconductor device in a display panel.

2. Description of the Related Art

In a device driving circuit that uses a high power semiconductor device, a heat sink is provided for dissipating heat generated by the semiconductor device. A device, such as a PDP in which display cells are defined by electrodes arranged to cross each other and in which display cells of the display panel are addressed by switching timing of each electrode for emitting light, uses a number of high power switching devices. Since the high power switching devices generate a great amount of heat, if the heat is not dissipated efficiently, the heat not only degrades the switching devices but also diminishes the overall performance of the driving circuit. Therefore, the high power switching devices are mounted on a driving circuit board and combined with a heat sink. The heat sink can be manufactured by several methods including extrusion molding.

A semiconductor device can be combined with a driving circuit board by soldering and with a heat sink by using screws. The heat sink can be combined with the semiconductor device by using screws and with the driving circuit board by a fixing member. In this manner, heat generated during operation of a driving circuit in a semiconductor device is dissipated into the air via the heat sink.

Screw holes for combining semiconductor devices are formed in a heat sink. The heat sink can be manufactured by a variety of methods. For example, a heat sink can be manufactured by extrusion molding with a material having a high heat conductivity, such as aluminum. The heat sink generally has two surfaces, a surface to maximize a contact area with the semiconductor device to absorb heat generated by the heat source by conduction and another surface to maximize a contact area with air for dissipating absorbed heat into the air. The semiconductor devices can be combined with the heat sink via screws inserted through fabrication holes formed in the semiconductor devices and the screw holes formed in the heat sink. The heat sink is combined with a driving circuit board by a fixing member.

The semiconductor devices are combined with the heat sink by using screws and with the driving circuit board by soldering. However, the semiconductor devices rotate in the screwing direction by the rotating force of the screws. In this case, the rotation of the semiconductor device can create significant problems in affixing the semiconductor devices to the driving circuit board. That is, the leads of the semiconductor devices are not in a correct position on the driving circuit board, and accordingly soldering must be performed by forced fitting, thereby damaging the leads of the semiconductor devices and the pattern on the printed circuit substrate.

SUMMARY OF THE INVENTION

The present invention provides a heat sink having a structure that can correctly and easily combine with semiconductor devices.

The present invention also provides a display panel comprising the heat sink according to the present invention.

According to an exemplary embodiment of the present invention, a heat sink is provided comprising: a first surface adapted to match and contact at least one semiconductor device; a second surface having a fin structure adapted to dissipate heat from the heat sink into the air, the second surface arranged opposite to the first surface; combining portions having combining holes adapted to be applied to a predetermined combining element to affix the at least one semiconductor device to the heat sink, the combining holes being arranged through the first surface and the second surface; and a protrusion arranged at a location of the first surface matching a point on an upper portion of the at least one semiconductor device; wherein the protrusion stops the at least one semiconductor device from rotating upon the at least one semiconductor device being affixed to the first surface of the heat sink by the combining element.

The protrusion can comprise a strip.

The protrusion can comprise a strip having a width equal to 40% of a thickness of the at least one semiconductor device.

The protrusion can comprise a bent structure accommodating a portion of the upper portion of the at least one semiconductor device.

According to another exemplary embodiment of the present invention, a heat sink is provided comprising: a first surface arranged to match and contact at least one semiconductor device; a second surface having a fin structure and adapted to dissipate heat from the heat sink into the air, the second surface arranged opposite to the first surface; combining portions having combining apertures each adapted to receive a predetermined combining element to affix the at least one semiconductor device to the heat sink, the combining apertures being formed through the first surface and the second surface; and at least one protrusion arranged on the first surface adjacent to a periphery of the at least one semiconductor device; wherein the protrusion stops the at least one semiconductor device from rotating upon the at least one semiconductor device being affixed to the first surface of the heat sink by the combining element.

The at least one protrusion can be arranged adjacent to a periphery of an upper portion of the at least one semiconductor device.

The at least one protrusion can be arranged adjacent to a periphery of a side surface of the at least one semiconductor device.

The at least one protrusion can be arranged at least one of adjacent to a periphery of an upper portion of the at least one semiconductor device or adjacent to a periphery of a side surface of the at least one semiconductor device.

According to yet another exemplary embodiment of the present invention, a display panel including a heat sink is provided, the heat sink comprising: a first surface arranged to match and contact at least one semiconductor device; a second surface having a fin structure and adapted to dissipate heat from the heat sink into the air, the second surface arranged opposite to the first surface; combining portions having combining holes and adapted to be applied to a predetermined combining element to affix the at least one semiconductor device to the heat sink, the combining holes formed through the first surface and the second surface; and at least one protrusion arranged on the first surface adjacent to a periphery of an upper portion of the at least one semiconductor device; wherein the protrusion stops the at least one semiconductor device from rotating upon the at least one semiconductor device being affixed to the first surface of the heat sink by the combining element.

The at least one protrusion can comprise a strip.

The at least one protrusion can comprise a strip having a width equal to 40% of a thickness of the at least one semiconductor device.

The at least one protrusion can comprise a bent structure accommodating a portion of the upper portion of the at least one semiconductor device.

According to still another exemplary embodiment of the present invention, a display panel including a heat sink is provided, the heat sink comprising: a first surface adapted to match and contact at least one semiconductor device; a second surface having a fin structure adapted to dissipate heat from the heat sink into the air, the second surface arranged opposite to the first surface; combining portions having combining holes adapted to be applied to a predetermined combining element to affix the at least one semiconductor device to the heat sink, the combining holes being arranged through the first surface and the second surface; and a protrusion arranged at a location of the first surface matching a point on an upper portion of the at least one semiconductor device; wherein the protrusion stops the at least one semiconductor device from rotating upon the at least one semiconductor device being affixed to the first surface of the heat sink by the combining element.

The at least one protrusion can be arranged adjacent to a periphery of an upper portion of the at least one semiconductor device.

The at least one protrusion can be arranged adjacent to a periphery of a side surface of the at least one semiconductor device.

The at least one protrusion can be arranged at least one of adjacent to a periphery of an upper portion of the at least one semiconductor device or adjacent to a periphery of a side surface of the at least one semiconductor device.

According to yet another exemplary embodiment of the present invention, a heat sink is provided comprising: a main body adapted to absorb heat generated by at least one heat generating device and to externally dissipate the absorbed heat, the main body being affixed to the at least one heat generating device; at least one stop extending from the main body and adapted to prevent displacement of the at least one heat generating device from a predetermined location on the main body upon the at least one heat generating device and the main body being affixed together.

The main body can comprise at least one aperture adapted to receive a respective at least one combining element passing therethrough, the at least one combining element adapted to affix the respective at least one heat generating device to the main body.

The at least one combining element can comprise a screw.

The at least one stop extending from the main body toward the at least one heat generating device can be arranged to contact at least one side of the respective at least one heat generating device.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
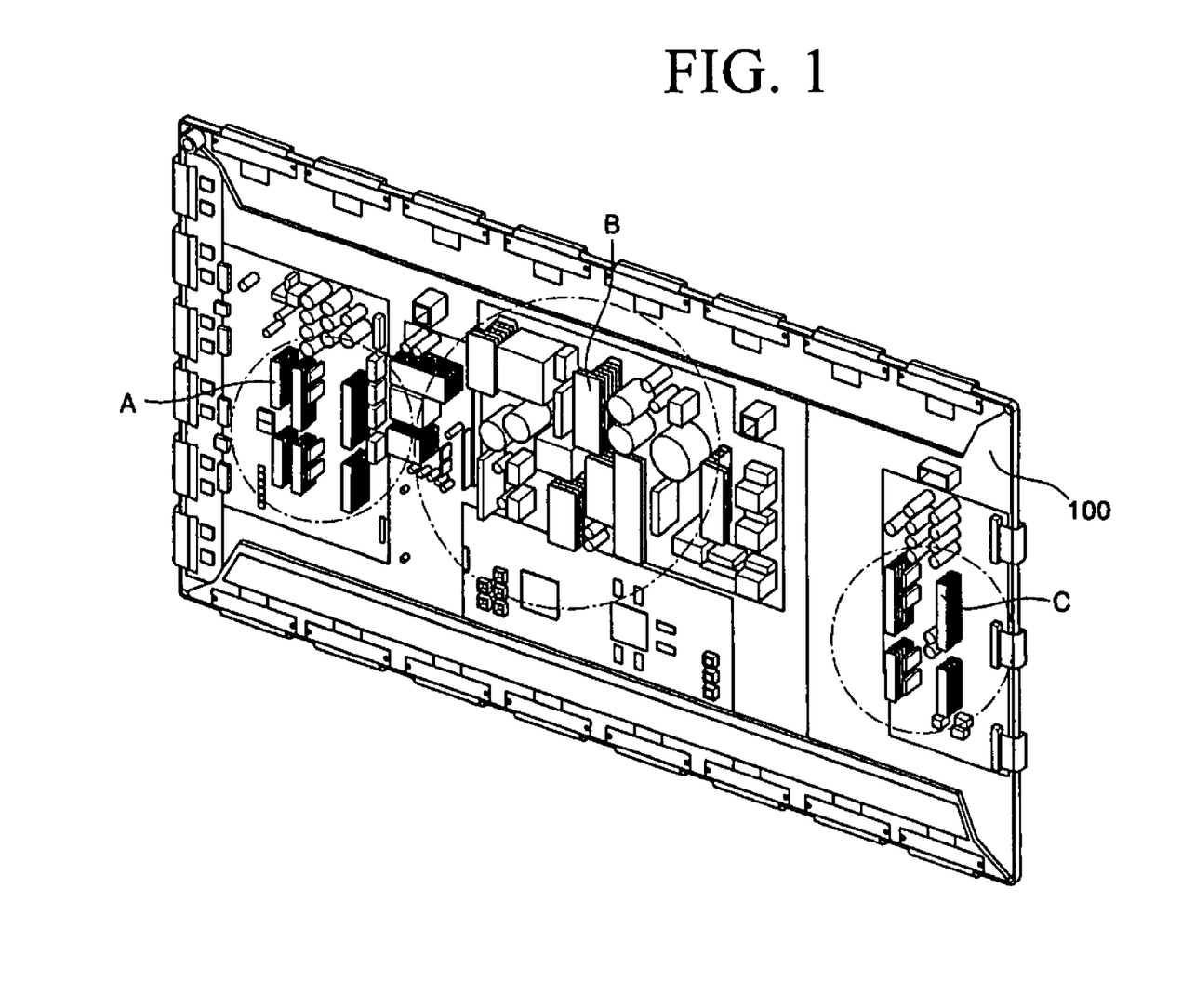
FIG. 1 is a view of an example of a driving circuit board mounted on a PDP.

FIG. 1 is a view of an example of a driving circuit board mounted on a Plasma Display Panel (PDP)100. In a device driving circuit that uses a high power semiconductor device, a heat sink is provided for dissipating heat generated by the semiconductor device. A device, such as a PDP in which display cells are defined by electrodes arranged to cross each other and in which display cells of the display panel are addressed by switching timing of each electrode for emitting light, uses a number of high power switching devices. Since the high power switching devices generate a great amount of heat, if the heat is not dissipated efficiently, the heat not only degrades the switching devices but also diminishes the overall performance of the driving circuit. Therefore, the high power switching devices are mounted on a driving circuit board, as shown in FIG. 1, combined with a heat sink. The heat sink can be manufactured by several methods including extrusion molding.

Figure 2:
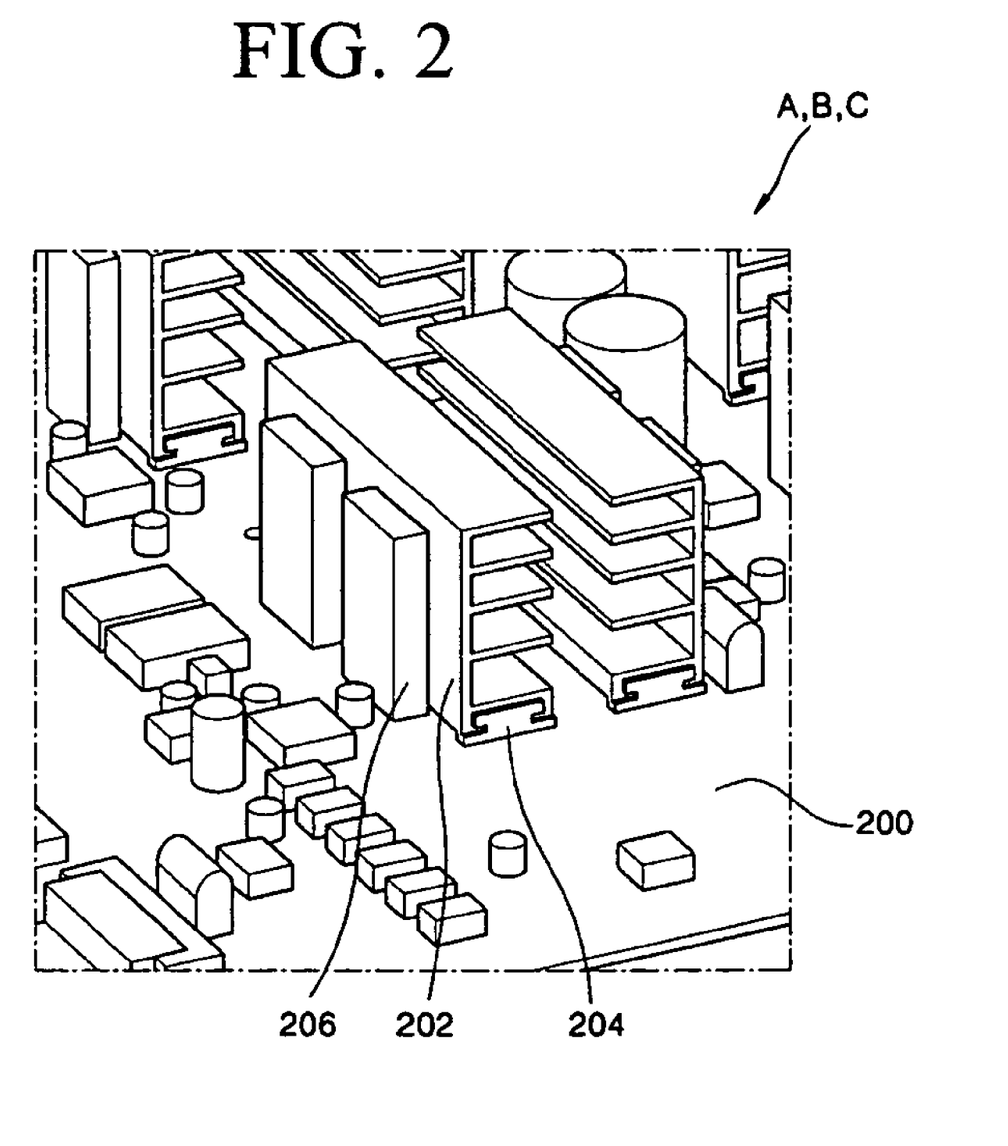
FIG. 2 is a magnified view of a combined portion of a semiconductor device with a heat sink in the driving circuit board of FIG. 1.

FIG. 2 is a magnified drawing of a portion which includes a heat sink combined with a semiconductor device in the driving circuit board of FIG. 1. A semiconductor device 206 can be combined with a driving circuit board 200 by soldering and with a heat sink 202 by using screws. The heat sink 202 can be combined with the semiconductor device 206 by using screws and with the driving circuit board 200 by a fixing member 204. In this manner, heat generated during operation of a driving circuit in a semiconductor device 206 is dissipated into the air via the heat sink 202.

Figure 3A:
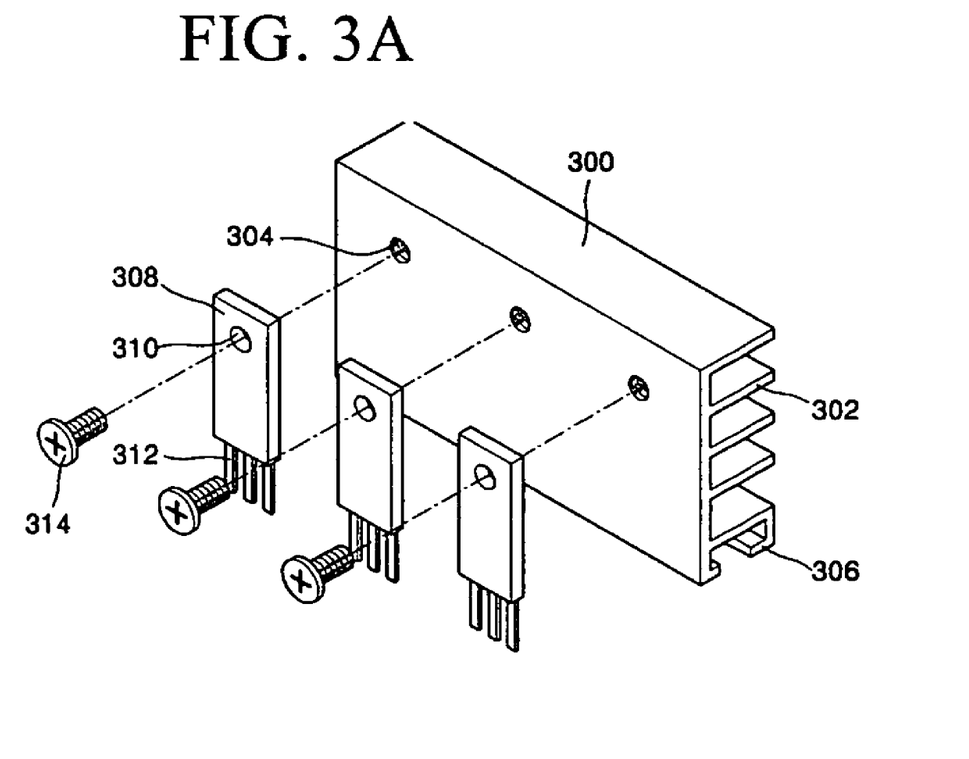
FIG. 3A is an exploded perspective view of a method of combining a at least one semiconductor device with the heat sink of FIG. 2.
Figure 3B:
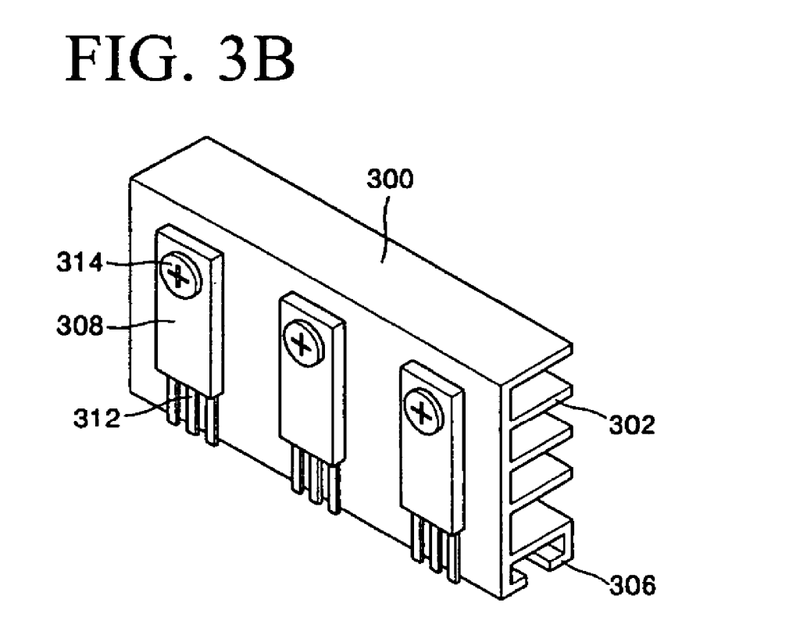
FIG. 3B is a perspective view of the heat sink of FIG. 3A, combined with a at least one semiconductor device.

FIG. 3A is an exploded perspective view of a method of combining a semiconductor device with a heat sink of FIG. 2. Screw holes 304 for combining semiconductor devices 308 are formed in a heat sink 300. The heat sink 300 can be manufactured by a variety of methods. However, the heat sink of FIG. 2 is an example of a heat sink manufactured by extrusion molding with a material having a high heat conductivity, such as aluminum. The heat sink 300 generally has two surfaces, a surface to maximize a contact area with the semiconductor device 308 to absorb heat generated by the heat source by conduction and another surface to maximize a contact area with air for dissipating absorbed heat into the air. As illustrated in FIG. 3A, the semiconductor devices 308 can be combined with the heat sink 300 via screws 314 inserted through fabrication holes 310 formed in the semiconductor devices 308 and the screw holes 304 formed in the heat sink 300. FIG. 3B is a view of a combined state of the semiconductor devices 308 and the heat sink 300. The heat sink 300 is combined with a driving circuit board 200 by a fixing member 306.

The semiconductor devices 308 are combined with the heat sink 300 by using the screws 314 and with the driving circuit board 200 by soldering. However, the semiconductor devices 308 rotate in the screwing direction by the rotating force of the screws 314. In this case, the rotation of the semiconductor device 308 can create significant problems in affixing the semiconductor devices 308 to the driving circuit board 200. That is, the leads of the semiconductor devices 308 are not in a correct position on the driving circuit board 200, and accordingly soldering must be performed by forced fitting, thereby damaging the leads of the semiconductor devices 308 and the pattern on the printed circuit substrate.

Hereinafter, a heat sink and a structure and operation of a display panel including the heat sink in accordance with embodiments of the present invention are described more fully with reference to the accompanying drawings.

The heat sink according to the present invention absorbs heat generated by one or more of semiconductor devices, and dissipates the absorbed heat.

Figure 4A:
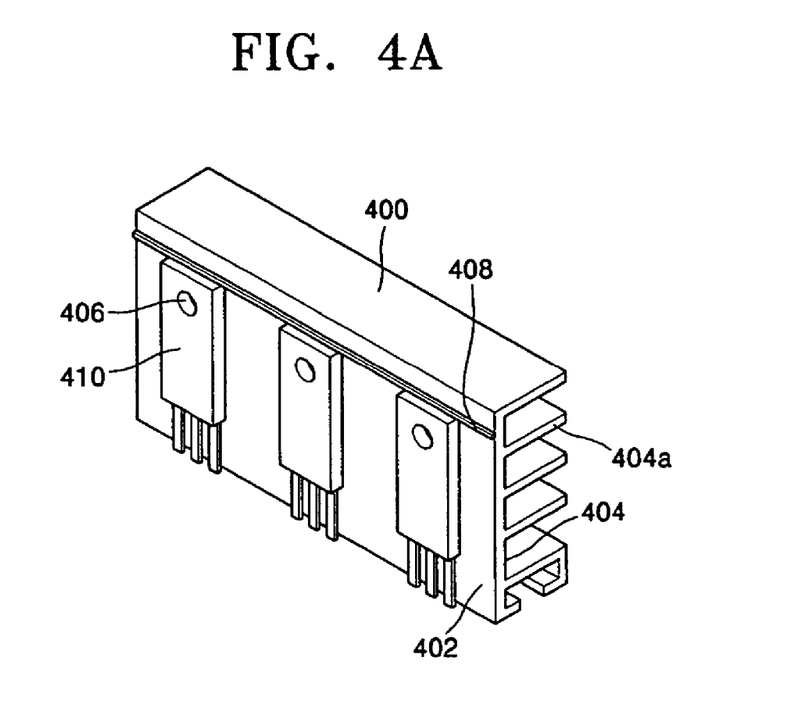
FIG. 4A is perspective view of a heat sink combined with a at least one semiconductor device according to a first embodiment of the present invention.
Figure 4B:
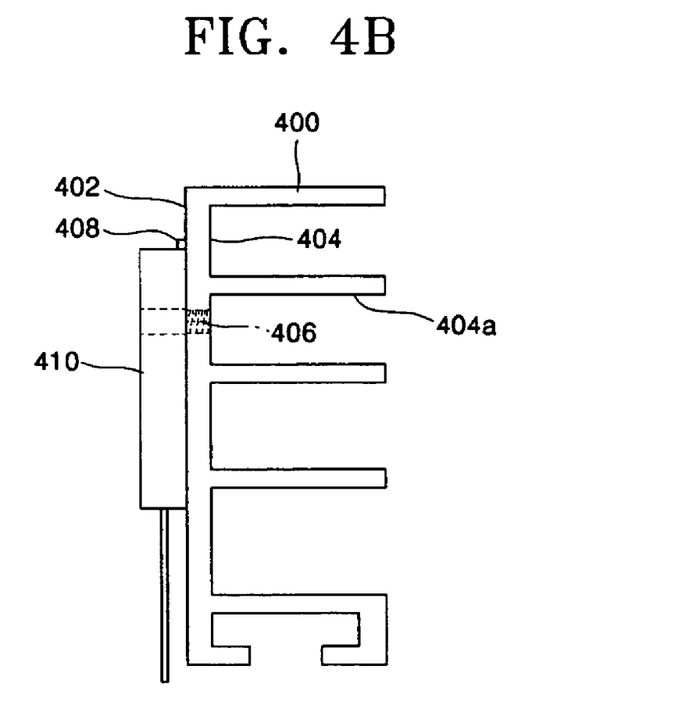
FIG. 4B is a right side view of the heat sink in FIG. 4A.

FIG. 4A is perspective view of a heat sink combined with a at least one semiconductor device, according to a first exemplary embodiment of the present invention, and FIG. 4B is a right side view of the heat sink of FIG. 4A. The heat sink 400 includes a first surface 402, a second surface 404, combining holes 406, and a protrusion 408. The heat sink 400 is combined with a at least one semiconductor device 410 by screws (not shown).

The first surface 402 is a surface that contacts the at least one semiconductor device 410. Heat generated by the at least one semiconductor device 410 during operation of the driving circuit is transferred to the heat sink 400 by conduction. The second surface 404 on the opposite surface of the first surface 402 is a surface for dissipating heat into the air, and the second surface 404 is formed with a dissipating fin structure 404a having a large air contact area.

The combining holes 406, are formed through the first surface 402 and the second surface 404 for affixing the semiconductor device to the heat sink 400. Threads for screws can be formed in the combining holes 406.

The protrusion 408 is formed on a location of the heat sink 400 matching an upper portion of the at least one semiconductor device 410 placed on the first surface 402. The protrusion 408 performs as a stop and does not allow the at least one semiconductor device 410 to rotate when the at least one semiconductor device 410 are affixed to the first surface 402 via the combining holes 406 and the attaching means (not shown), such as screws.

As depicted in FIG. 4A, the protrusion 408 can be formed as a protruding strip at a location matching the upper portion of the at least one semiconductor device 410. A width of the protrusion 408 can be more than 40% of the thickness of the at least one semiconductor device 410 for effectively stopping the rotation of the at least one semiconductor device 410. For example, if the thickness of the at least one semiconductor device 410 is 5 mm, the width of the protrusion is preferably more than 2 mm. Also, if the thickness of the at least one semiconductor device 410 is 3 mm, the width of the protrusion is preferably more than 1.2 mm.

Figure 4C:
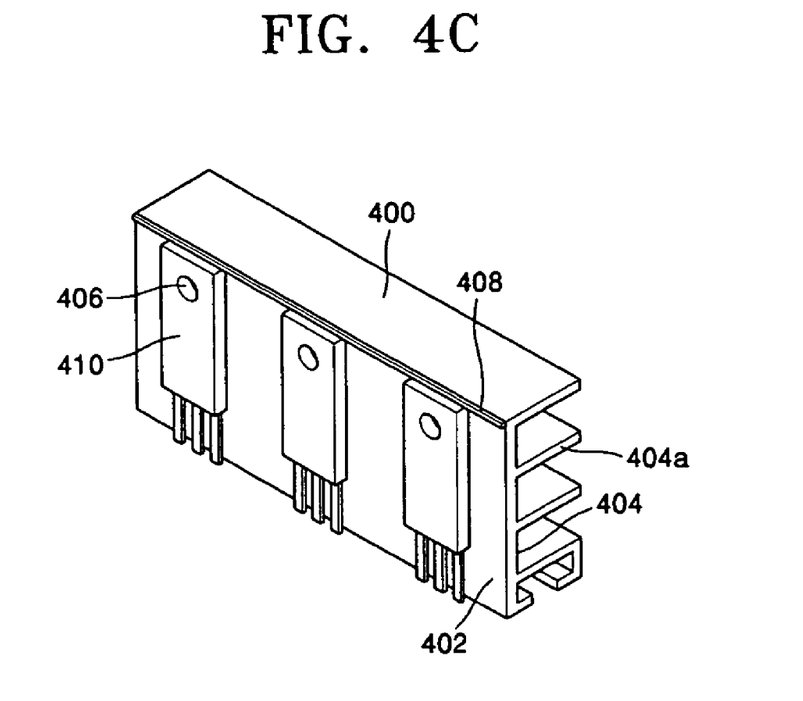
FIG. 4C is a perspective view of a modified version of the heat sink of FIG. 4A combined with a plurality of a at least one semiconductor device.

FIG. 4C is a perspective view of a modified version of the heat sink of FIG. 4A, combined with at least one semiconductor device, in which the protrusion 408 is formed on a top portion of the heat sink 400. The embodiment of the heat sink of FIG. 4C becomes small if the at least one semiconductor device of the same size are combined.

The location of the protrusion 408 in FIGS. 4A and 4C can vary according to the size of the heat sink 400 determined by the size of the at least one semiconductor device 410 and the amount of heat generated by the at least one semiconductor device 410.

Figure 5A:
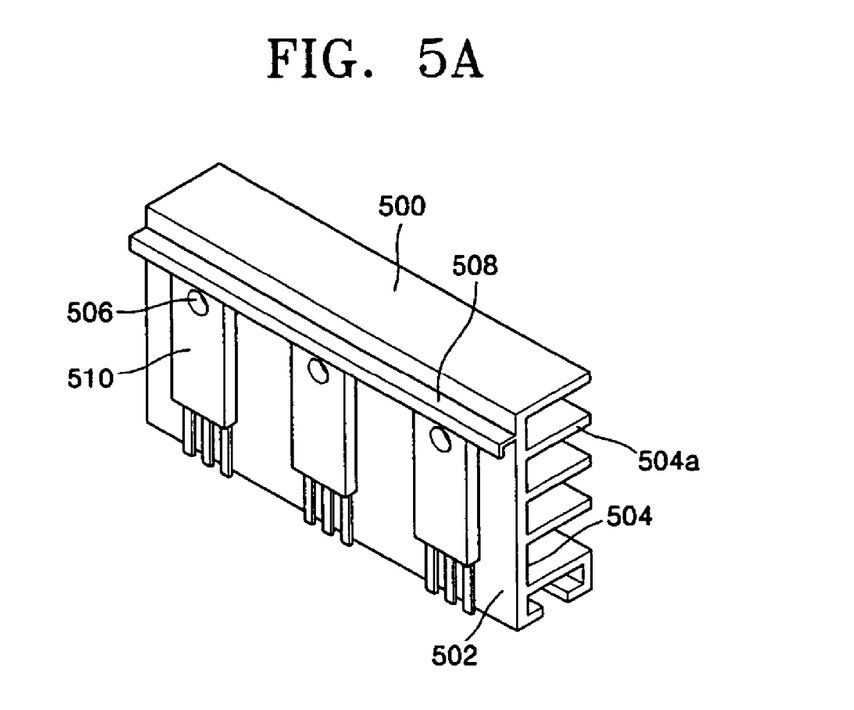
FIG. 5A is perspective view of a heat sink combined with a at least one semiconductor device according to a second embodiment of the present invention.
Figure 5B:
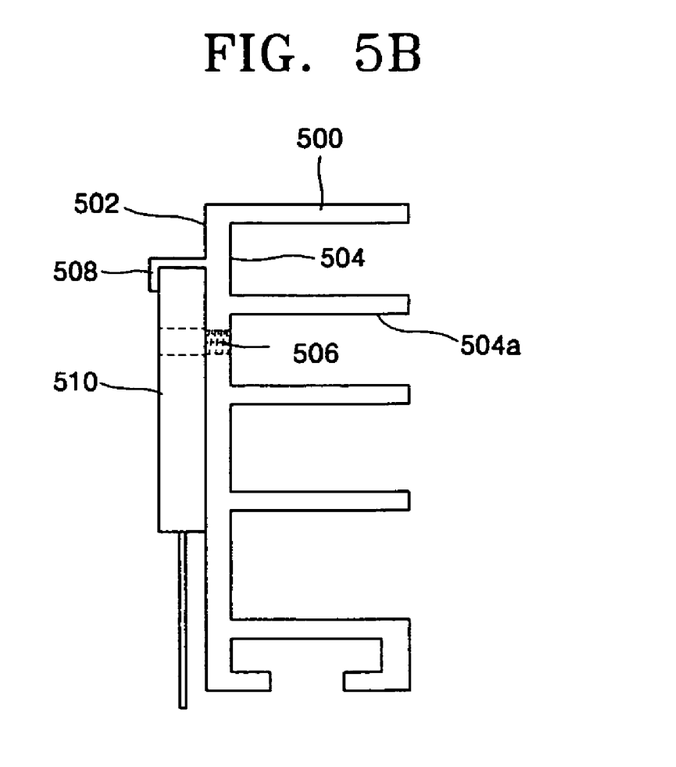
FIG. 5B is a right side view of the heat sink of FIG. 5A.

FIG. 5A is a perspective view of a heat sink combined with at least one semiconductor device, according to a second exemplary embodiment of the present invention, and FIG. 5B is a right side view of the heat sink of FIG. 5A. The heat sink 500 includes a first surface 502, a second surface 504, combining holes 506, and a protrusion 508, and is combined with at least one semiconductor device 510 by an attaching means (not shown), such as screws. Except for the protrusion 508, the basic shape of the heat sink 500 and the attachment to the at least one semiconductor device 510 are the same as in the case of the heat sink 400 of FIG. 4A.

The protrusion 508 is formed at a location of the heat sink 500 matching an upper portion of the at least one semiconductor device 510 placed on the first surface 502. The protrusion 508 acts as a stop and does not allow the at least one semiconductor device 510 to rotate when the at least one semiconductor device 510 are fixed to the first surface 502 via the combining holes 506 and the attaching means (not shown), such as screws. Referring to FIG. 5B, the protrusion 508 is formed such that an upper portion of the heat sink 500 extends as much as a thickness of the upper portion of the at least one semiconductor device 510 and then the extended portion is bent vertically downward. The vertically bent shape of the protrusion 508 enables the at least one semiconductor device 510 to tightly contact the first surface 502. That is, according to the exemplary embodiment of FIG. 5A, the protrusion 508 acts as a stop that does not allow the at least one semiconductor device 510 to rotate and as an assembling guide for the at least one semiconductor device 510.

The shape of the protrusion 508 can vary according to a corresponding shape of the upper portion of the at least one semiconductor device 510.

Figure 5C:
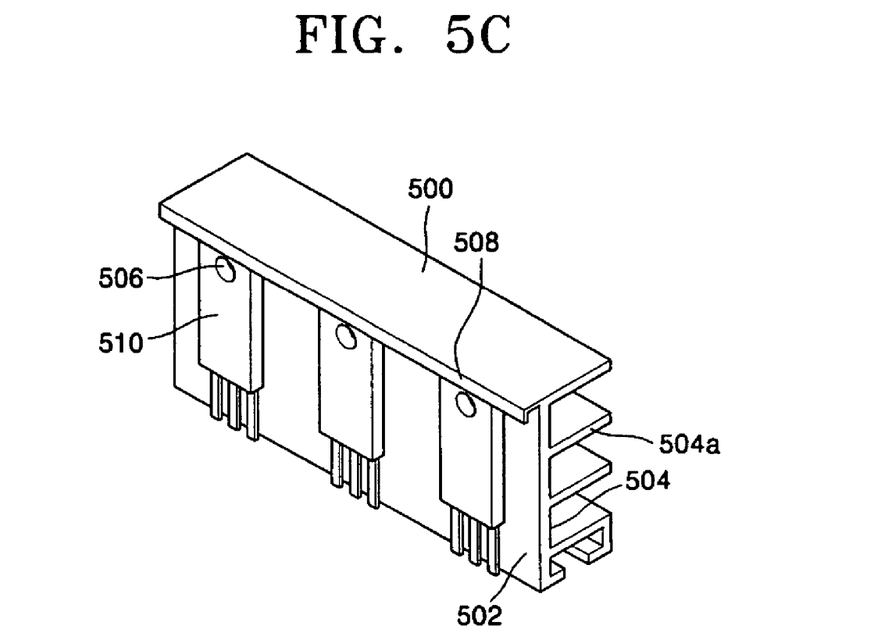
FIG. 5C is a perspective view of a modified version of the heat sink of FIG. 5A combined with a at least one semiconductor device.

FIG. 5C is a perspective view of a modified version of the heat sink of FIG. 5A, combined with at least one semiconductor device, in which the protrusion 508 is formed by extending the upper portion of the heat sink 500.

In comparison with the heat sink of FIG. 5A, the exemplary embodiment of FIG. 5C is an example of a heat sink that has a reduced heat-dissipating surface relative to the size of the at least one semiconductor device 510.

Figure 6A:
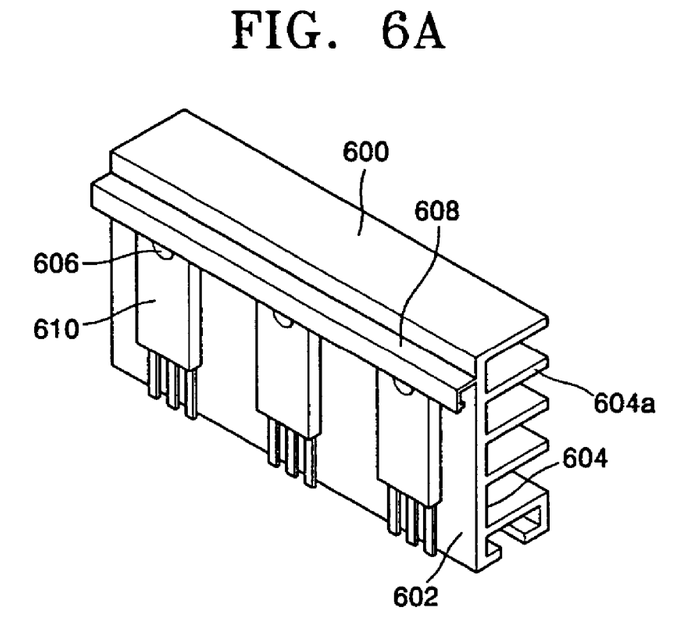
FIG. 6A is perspective view of a heat sink combined with a at least one semiconductor device, according to a third exemplary embodiment of the present invention.
Figure 6B:
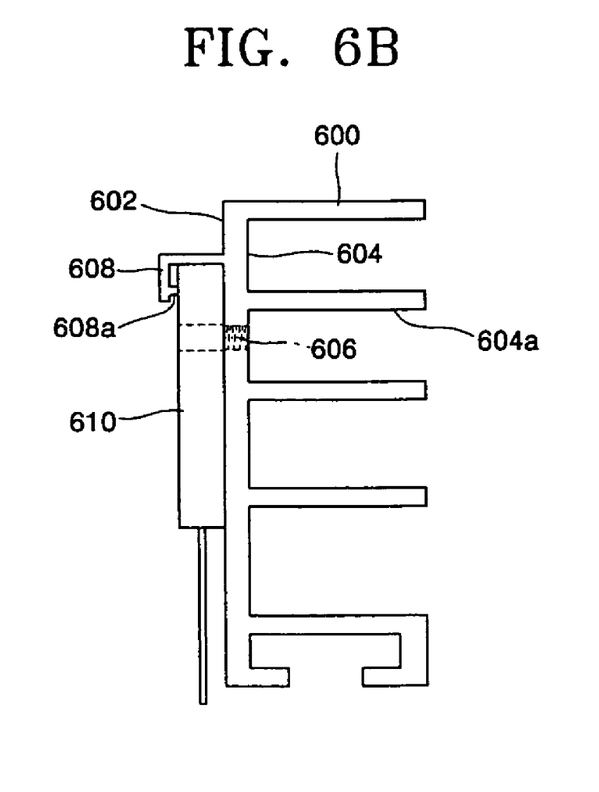
FIG. 6B is a right side view of the heat sink of FIG. 6A.

FIG. 6A is a perspective view of a heat sink combined with at least one semiconductor device, according to a third exemplary embodiment of the present invention. FIG. 6B is a right side view of the heat sink of FIG. 6A.

The heat sink 600 includes a first surface 602, a second surface 604, combining holes 606, and a protrusion 608, and is combined with at least one semiconductor device 610 by an attachment means (not shown), such as screws. Except for the protrusion 608, the basic shape of the heat sink 600 and the attachment to the at least one semiconductor device 610 are the same as in the case of the heat sink 500 of FIG. 5A. The protrusion 608 is formed at a location of the heat sink 600 matching an upper portion of the at least one semiconductor device 610 placed on the first surface 602. The protrusion 608 acts as a stop and does not allow the at least one semiconductor device 610 to rotate when the at least one semiconductor device 610 are affixed to the first surface 602 via the combining holes 606 and the attachment means (not shown), such as screws. Referring to FIG. 6B, the protrusion 608 is formed such that an upper portion of the heat sink 600 extends as much as a thickness of the upper portion of the at least one semiconductor device 610 and the extended portion is bent vertically downward. Then, a protrusion 608a protruding inward is formed at the lower end portion of the bent portion. The protrusion 608a on the bent portion of the protrusion 608 enables the at least one semiconductor device 610 to tightly contact the first surface 602.

Figure 6C:
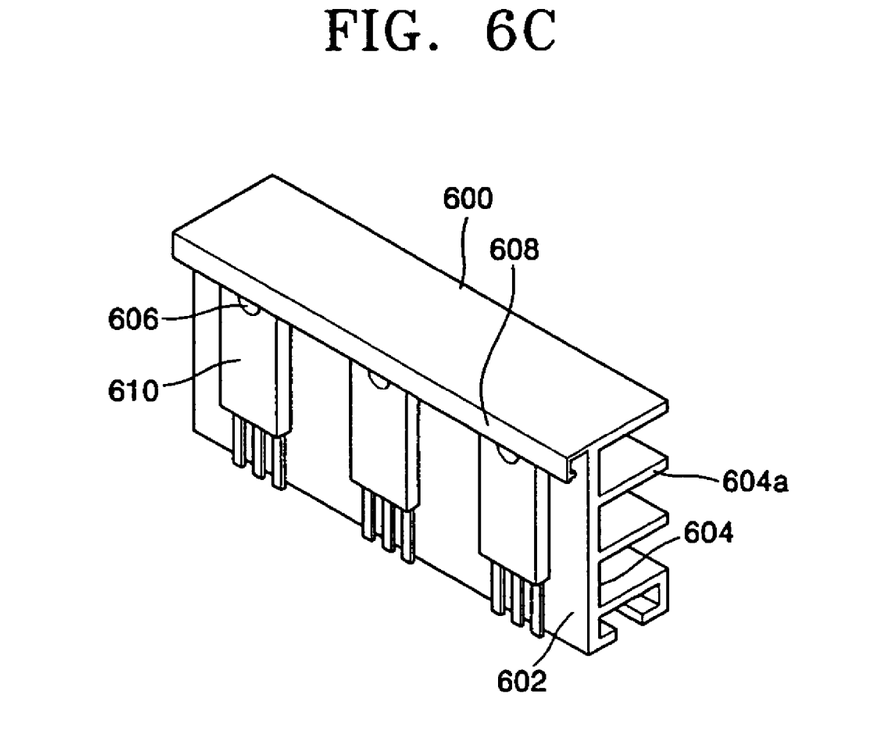
FIG. 6C is a perspective view of a modified version of the heat sink of FIG. 6A combined with a at least one semiconductor device.

FIG. 6C is a perspective view of a modified version of the heat sink of FIG. 6A, combined with at least one semiconductor device, in which the protrusion 608 is formed by extending the upper portion of the heat sink 600. In comparison with the heat sink of FIG. 5A, the exemplary embodiment of FIG. 5C is an example of a heat sink that has a reduced heat-dissipating surface relative to the size of the at least one semiconductor device 510.

Figure 7A:
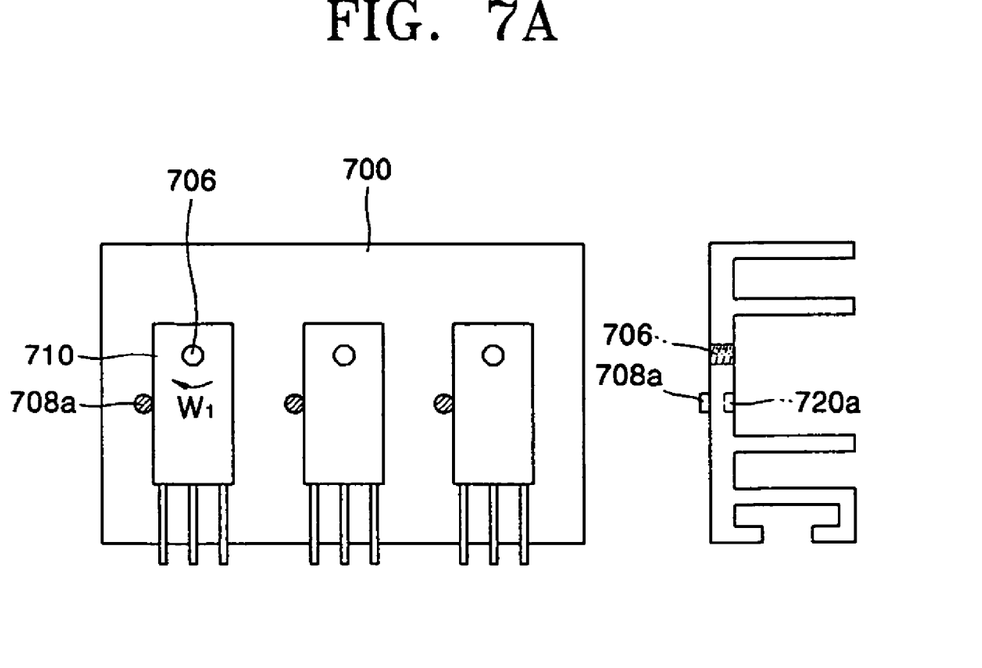
FIG. 7A is a plan view of a heat sink combined with a at least one semiconductor device according to a fourth embodiment of the present invention.

FIG. 7A is a plan view of a heat sink combined with at least one semiconductor device according to a fourth exemplary embodiment of the present invention, in which the protrusion is formed by a single protrusion. The heat sink 700 comprises a first surface 702 that contacts the at least one semiconductor device, a second surface 704 having a dissipating fin structure 704a for dissipating the heat of the heat sink 700, formed on the side opposite to the first surface 702, combining holes 706 formed through the first surface 702 and the second surface 704 for combining the at least one semiconductor device to the heat sink 700 via an attaching means (not shown), such as screws, and protrusions 708a formed at a location matching a left surface of the at least one semiconductor device 710 on the first surface 702. A circular shaped protrusion 708a is formed at a location of the heat sink 700 matching the left surface of the at least one semiconductor device 710 at a predetermined distance below a combining hole 706 to stop the at least one semiconductor device 710 from rotating in the screwing direction W1. The protrusion 708a can be located at a location of the heat sink 700 matching a left surface of the at least one semiconductor device 710 as in FIG. 7A, or can be located on an upper portion or a right side of the at least one semiconductor device 710.

Figure 7B:
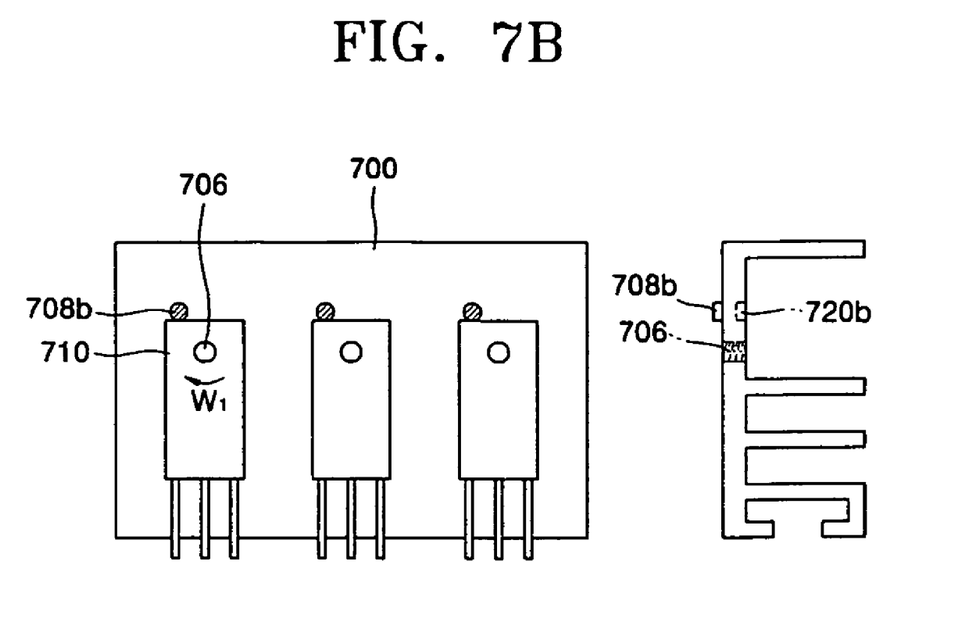
FIGS. 7B through 7D are plan views of a modified version of the heat sink of FIG. 7A combined with a at least one semiconductor device.
Figure 7C:
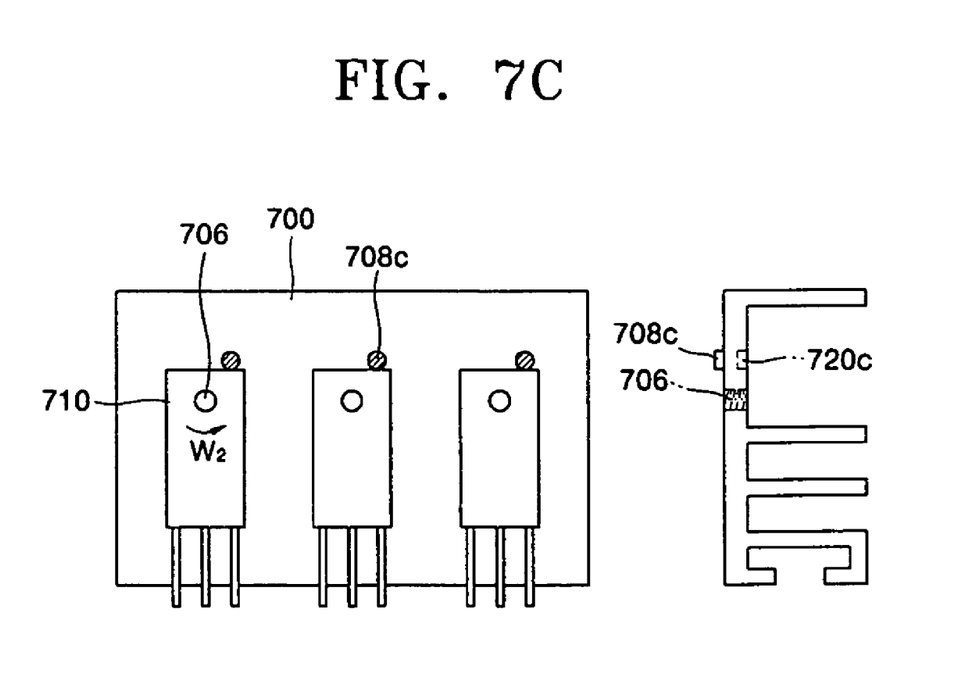
Figure 7D:
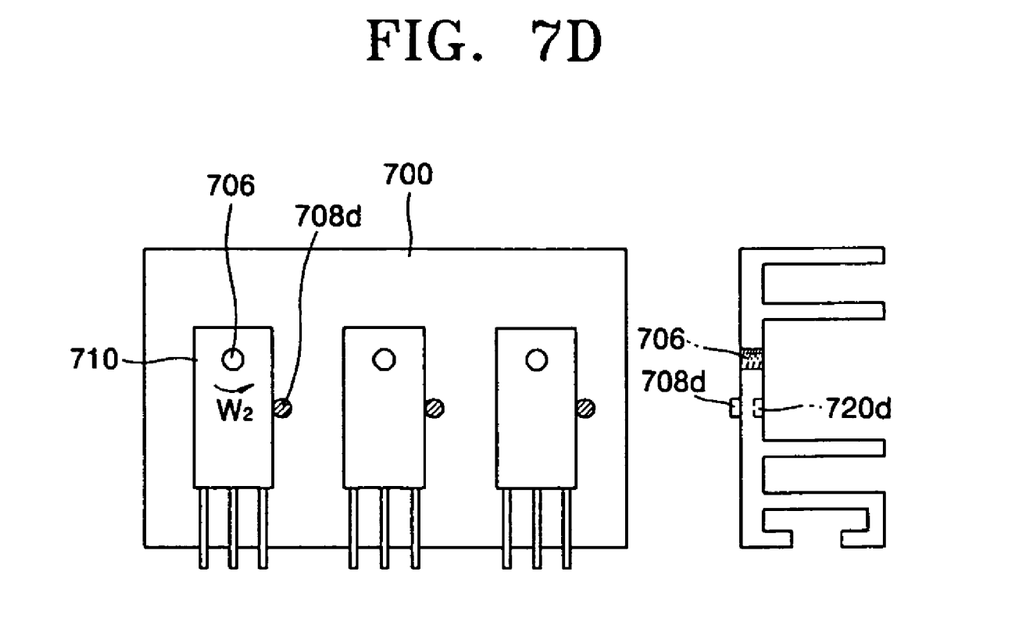

FIGS. 7B through 7D are plan views of modified versions of the heat sink of FIG. 7A, combined with at least one semiconductor device. As depicted in FIG. 7B, if the protrusion 708b is formed at a location of the heat sink 700 matching a left surface of an upper portion of the at least one semiconductor device 710 at a predetermined distance from a combining hole 706, the protrusion 708b can stop the at least one semiconductor device 710 from rotating in the screwing direction W1. As depicted in FIG. 7C, if the protrusion 708c is formed at a location of the heat sink 700 matching a right surface of an upper portion of the at least one semiconductor device 710 at a predetermined distance from a combining hole 706, the protrusion 708c can stop the at least one semiconductor device 710 from rotating in the unscrewing direction W2. As depicted in FIG. 7D, if the protrusion 708d is formed at a location of the heat sink 700 matching a right surface of the at least one semiconductor device 710 at a predetermined distance below a combining hole 706, the protrusion 708d can stop the at least one semiconductor device 710 from rotating in the unscrewing direction W2.

Figure 7E:
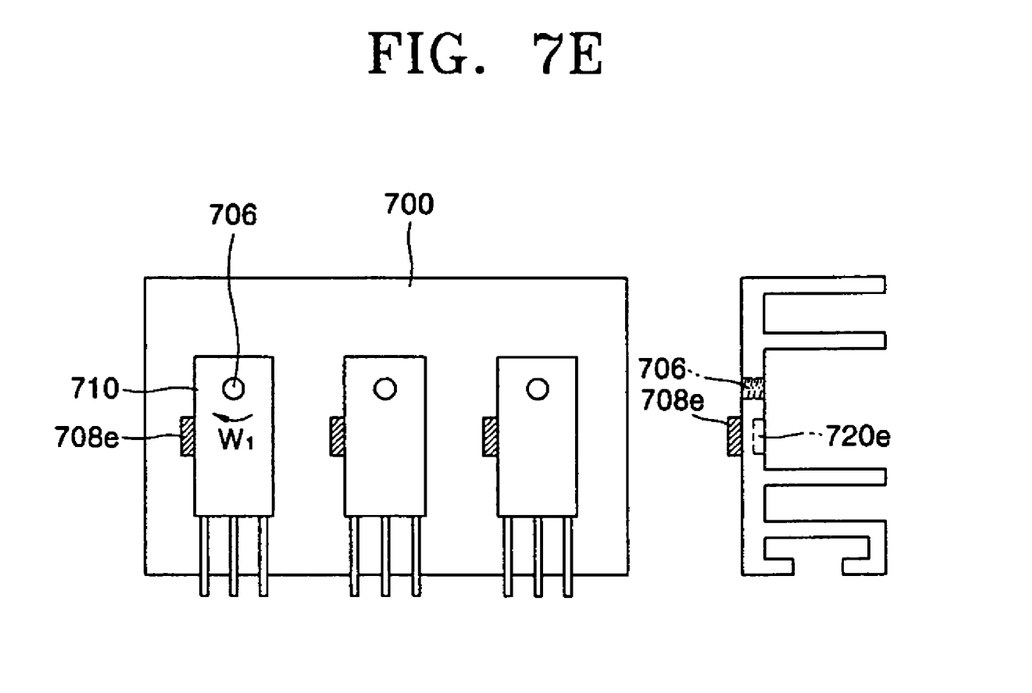
FIG. 7E is a plan view of a modified heat sink of FIG. 7A combined with a at least one semiconductor device.

FIG. 7E is a plan view of a modified version of the heat sink of FIG. 7A, combined with at least one semiconductor device, in which the protrusion 708e has a rectangular shape. The protrusion 708e can have the same functions as the previous protrusions but the shape thereof is different. With regard to the forming locations, the protrusion 708a can be located as in the case of the modified versions of the heat sinks of FIGS. 7B through 7D.

Except for the embodiments illustrated in FIGS. 7A through 7E, the numbers and forms of the protrusions 708a through 708e can vary. That is, one or more protrusions with different shapes can be formed at a location of the heat sink 700 matching the outer surface of the at least one semiconductor device 710.

In the exemplary embodiments of FIGS. 7A through 7E, the protrusions 708a through 708e can be formed together with embosses 720a through 720e for forming the combining holes 706 after forming the heat sink body 700 by extrusion molding. When forming a heat sink using an aluminum plate by pressing, the protrusions 708a through 708e can be formed by embossing during a shearing or bending process.

Figure 8A:
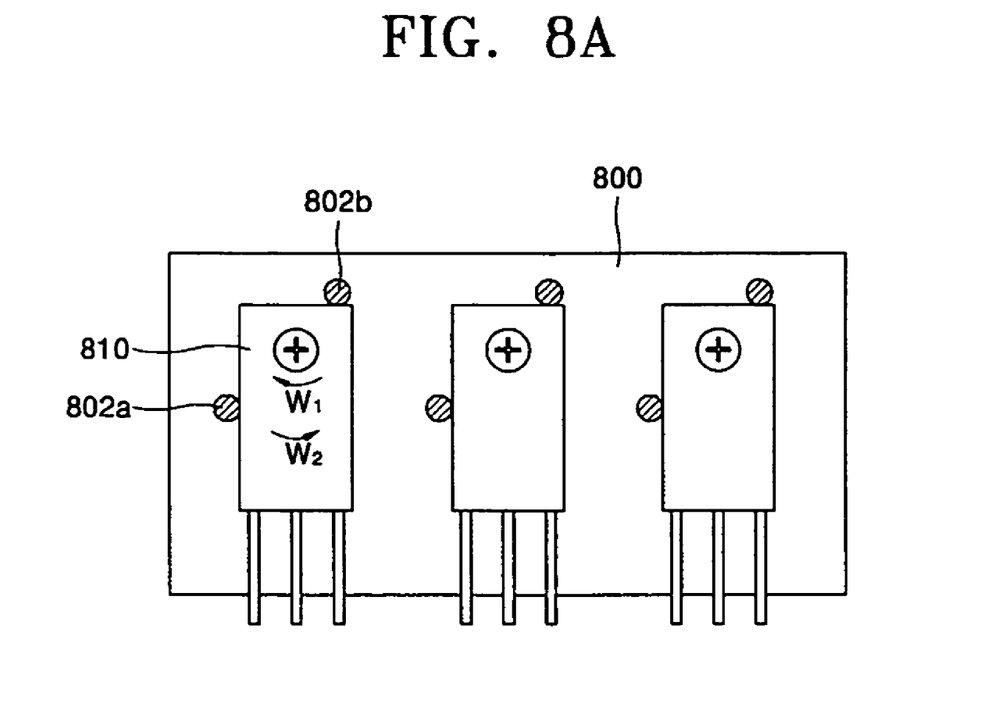
FIG. 8A is a plan view of a heat sink combined with a at least one semiconductor device according to a fifth embodiment of the present invention.

FIG. 8A is a plan view of a heat sink combined with at least one semiconductor device, according to a fifth exemplary embodiment of the present invention, in which two protrusions are provided. The protrusions 808a and 808b include a first protrusion 808a and a second protrusion 808b. The first protrusion 808a is formed at a location of the heat sink 800 matching a point on the left surface of the at least one semiconductor device 810 at a predetermined distance below a combining hole 806, and stops the semiconductor device 810 from rotating in the screwing direction W1. The second protrusion 808b is formed to match an upper side of the at least one semiconductor device 810 and guides a fabrication location of the at least one semiconductor device 810. If the second protrusion 808b is formed at a location of the heat sink 800 matching a point on the right surface of the at least one semiconductor device 810 at a predetermined distance from the attachment hole 806, the protrusion 808b can not only guide the assembly of the at least one semiconductor device 810 but also stop the at least one semiconductor device 810 from rotating in the unscrewing direction W2.

Figure 8B:
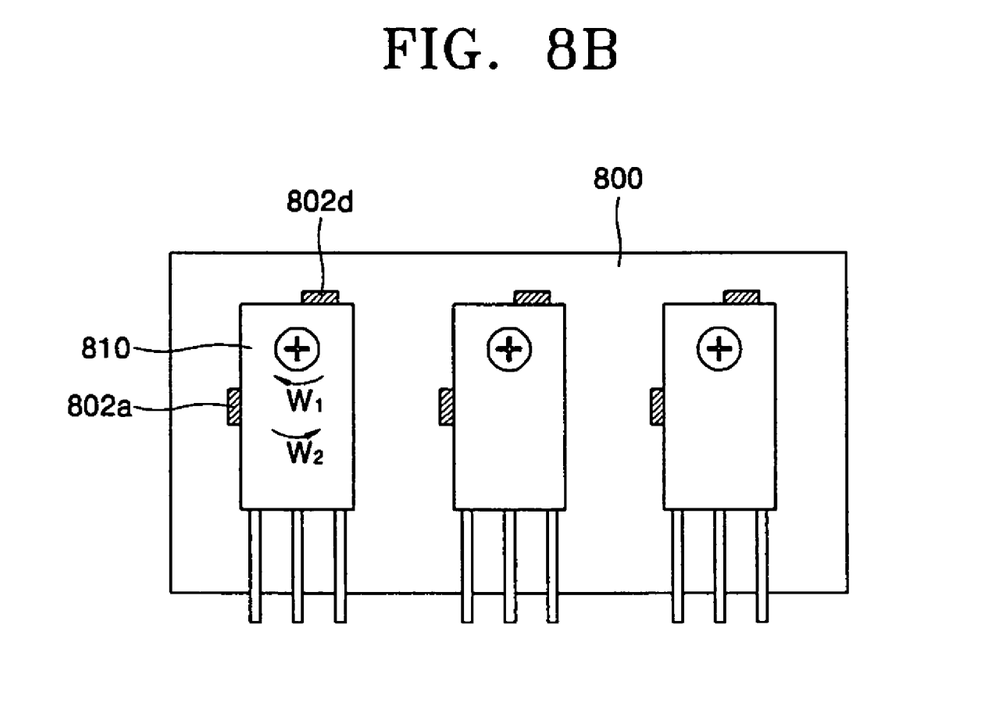
FIG. 8B is a plan view of a modified version of the heat sink of FIG. 8A combined with a at least one semiconductor device.

FIG. 8B is a plan view of a modified version of the heat sink of FIG. 8A, combined with at least one semiconductor device, in which the protrusions 808c and 808d are formed in a rectangular shape. The protrusions 808c and 808d have the same locations and functions as the protrusions 808a and 808b of FIG. 8A.

Figure 9A:
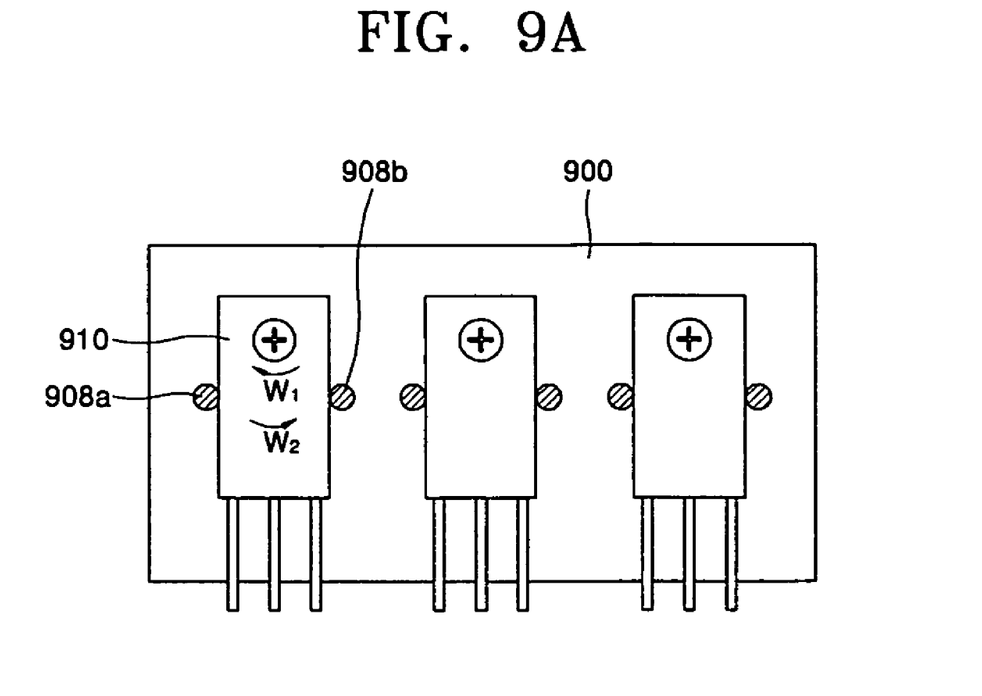
FIG. 9A is a plan view of a heat sink combined with a at least one semiconductor device according to a sixth embodiment of the present invention.

FIG. 9A is a plan view of a heat sink combined with at least one semiconductor device according to a sixth exemplary embodiment of the present invention. The protrusions 908a and 908b include a first protrusion 908a and a second protrusion 908b. The first protrusion 908a is formed at a location on the heat sink 900 marching a point on a left surface of the at least one semiconductor device 910 at a predetermined distance below a combining hole 906, and stops the at least one semiconductor device 910 from rotating in the screwing direction W1. The second protrusion 980b is formed at a location on the heat sink 900 matching a point on a right surface of the at least one semiconductor device 910 at a predetermined distance below a combining hole 906, and stops the at least one semiconductor device 910 from rotating in the unscrewing direction W2.

Figure 9B:
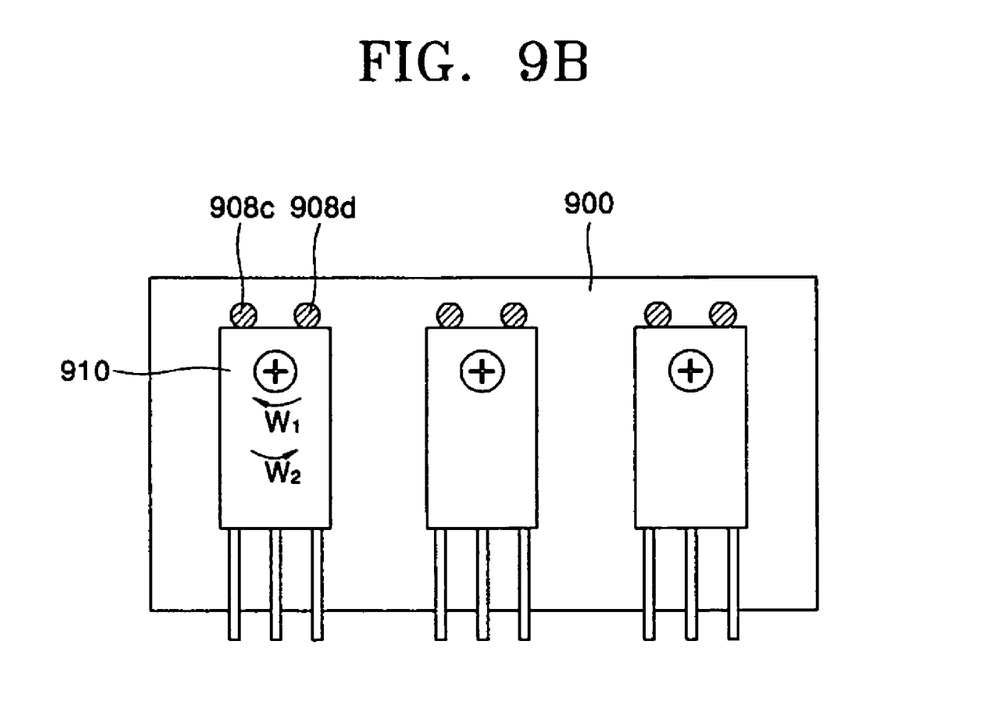
FIG. 9B is a plan view of a modified version of the heat sink of FIG. 9A combined 8 with a at least one semiconductor device.

FIG. 9B is a plan view of a modified version of the heat sink of FIG. 9A combined with at least one semiconductor device. The protrusions 908c and 908d include a first protrusion 908c and a second protrusion 908d. The first protrusion 908c is formed at a location of the heat sink 900 matching a point on the left surface of the at least one semiconductor device 910 at a predetermined distance from a combining hole 906, and the protrusion 908c stops the at least one semiconductor device 910 from rotating in the screwing direction W1. The second protrusion 908d is formed at a location of the heat sink 900 matching a point on the right surface of the at least one semiconductor device 910 at a predetermined distance from a combining hole 906, and the protrusion 908d stops the at least one semiconductor device 910 from rotating in the unscrewing direction W2.

Figure 10:
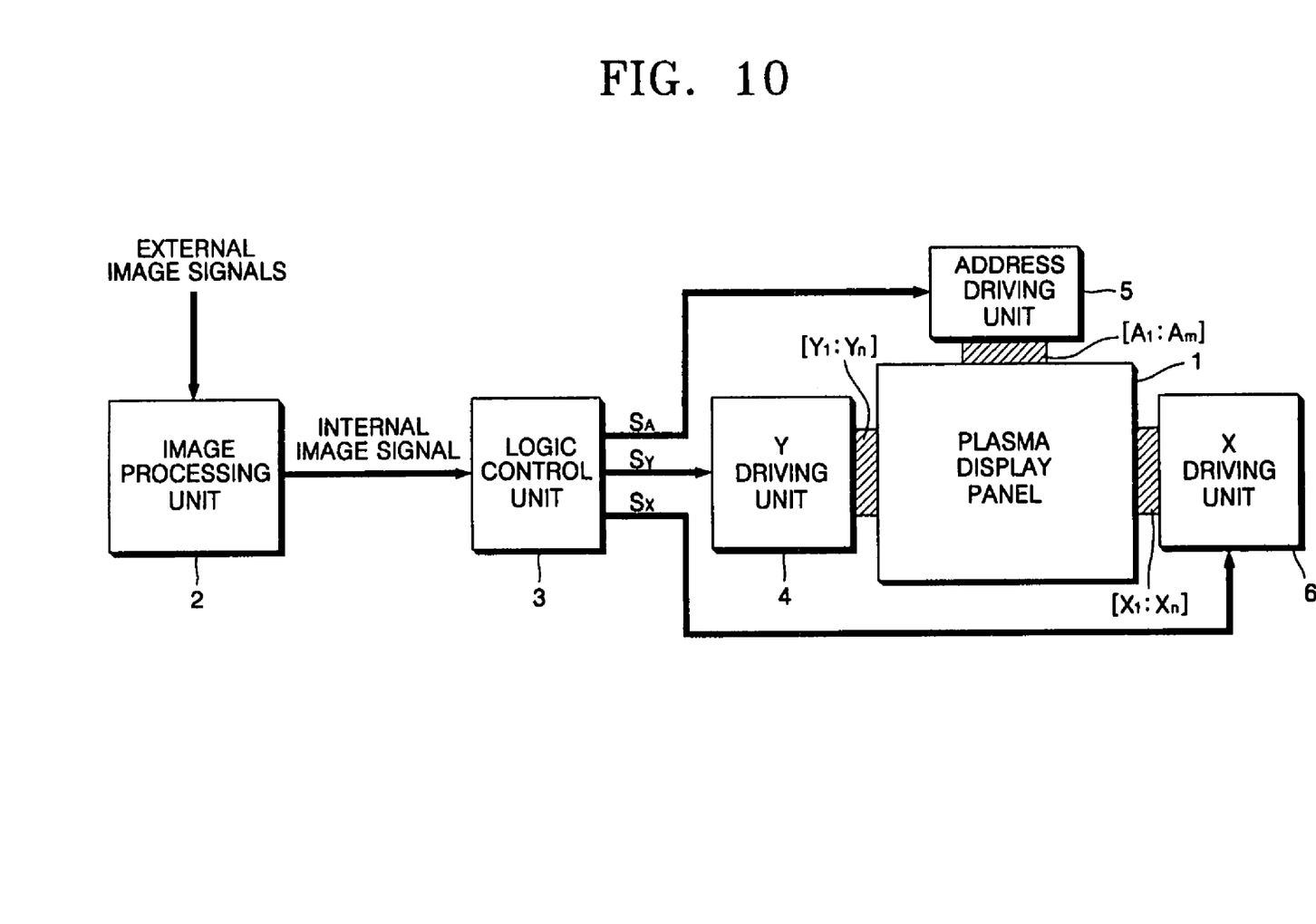
FIG. 10 is a block diagram of an example of a plasma display device that can employ a driving circuit having a heat sink combined with semiconductor devices according to the present invention.

FIG. 10 is a block diagram of an example of a plasma display device that can employ a driving circuit having a heat sink combined with at least one semiconductor device according to the present invention.

Referring to FIG. 10, a driving device of a plasma display panel 1 comprises an image processing unit 2, a logic control unit 3, an address driving unit 5, an X driving unit 6, and a Y driving unit 4. The image processing unit 2 transforms external analog image signals into digital signals, and then generates internal image signals such as 8 bit red R, green G, and blue B image signals, clock signals, and vertical and horizontal synchronizing signals. The logic control unit 3 generates driving control signals SA, SY, and SX according to the internal image signals received from the image processing unit 2. The address driving unit 5 generates a display data signal by processing the address signal SA received from the logic control unit 3, and applies the generated display data signal to the address electrodes A1, A2, . . . , and Am. The X driving unit 6 processes the X driving signal SX received from the logic control unit 3 and applies the X driving signal SX to the X electrodes. The Y driving unit 4 processes the Y driving signal SY received from the logic control unit 3 and applies the Y driving signal SY to the Y electrodes. At this time, the display cells in the panel 1 are selected by turning on the address electrodes and the Y electrodes at the same time. The selected display cells are discharged by alternately turning on the Y electrodes and the X electrodes. For this driving operation of the panel 1, a number of high power switching semiconductor devices are used on the driving circuit. Also, for high efficiency of a driving operation of the panel, high power switching semiconductor devices are used in the energy recovery circuit included in the driving circuit board.

A power supply circuit (not shown) is included in a driving circuit board of the display panel device. Recently, as a miniaturized and highly efficient of power supply circuit, a Switching Mode Power Supply (SMPS) is widely used. The SMPS uses many high power switching devices.

For manufacturing a driving circuit board of a device of FIG. 10, the present invention provides a heat sink that can easily be combined with at least one heat generating semiconductor device.

As described above, according to the heat sink and the display panel comprising the heat sink, semiconductor devices and the heat sink can be correctly and easily combined by an assembly guide provided on the heat sink. Therefore, a failure rate in manufacturing driving circuit boards can be reduced. Also, an additional heat dissipation effect can be achieved by adding the assembly guide since the assembly guide increases heat dissipation area.

While this invention has been particularly shown and described with reference to exemplary embodiments thereof, it will be understood by those skilled in the art that various changes in form and details can be made therein without departing from the spirit and scope of the present invention as recited in the appended claims. The exemplary embodiments should be considered in a descriptive sense only and not for purposes of limitation. Therefore, the scope of the present invention is defined not by the detailed description thereof but by the appended claims, and all differences within the scope will be construed as being included in the present invention.

What is claimed is:

1. A heat sink comprising:
   a first surface adapted to match and contact at least one semiconductor device;
   a second surface having a fin structure adapted to dissipate heat from the heat sink into the air, the second surface arranged opposite to the first surface;
   combining portions having combining holes adapted to be applied to a predetermined combining element to affix the at least one semiconductor device to the heat sink, the combining holes being arranged through the first surface and the second surface; and
   a protrusion arranged at a location of the first surface matching a point on an upper portion of the at least one semiconductor device;
   wherein the protrusion stops the at least one semiconductor device from rotating upon the at least one semiconductor device being affixed to the first surface of the heat sink by the combining element; and wherein the protrusion includes a bent portion accommodating a portion of the upper portion of the at least one semiconductor device.

2. The heat sink of claim 1, wherein the protrusion comprises a strip.

3. The heat sink of claim 1, wherein the protrusion comprises at least one protrusion, protruding inward towards the first surface and arranged at the bent portion.

4. A display panel including a heat sink, the heat sink comprising:
- a first surface arranged to match and contact at least one semiconductor device;
- a second surface having a fin structure and adapted to dissipate heat from the heat sink into the air, the second surface arranged opposite to the first surface;
- combining portions having combining holes and adapted to be applied to a predetermined combining element to affix the at least one semiconductor device to the heat sink, the combining holes formed through the first surface and the second surface; and
- at least one protrusion arranged on the first surface adjacent to a periphery of an upper portion of the at least one semiconductor device;
- wherein the protrusion stops the at least one semiconductor device from rotating upon the at least one semiconductor device being affixed to the first surface of the heat sink by the combining element; and
- the at least one protrusion includes a bent portion accommodating a portion of the upper portion of the at least one semiconductor device.

5. The display panel of claim 4, wherein the at least one protrusion comprises a strip.

6. The display panel of claim 4, wherein the at least one protrusion comprises at least one protrusion, protruding inward towards the first surface and arranged at the bent portion.

* * * * *